United States Patent [19]

Hayakawa

[11] Patent Number: 5,779,520

[45] Date of Patent: Jul. 14, 1998

[54] METHOD AND APPARATUS OF POLISHING WAFER

[75] Inventor: Hideaki Hayakawa, Kanagawa, Japan

[73] Assignee: Sony Corporation, Tokyo, Japan

[21] Appl. No.: 898,386

[22] Filed: Jul. 22, 1997

Related U.S. Application Data

[63] Continuation of Ser. No. 701,561, Aug. 22, 1996, abandoned, which is a continuation of Ser. No. 337,482, Nov. 8, 1994, abandoned.

[30] Foreign Application Priority Data

Nov. 9, 1993 [JP] Japan .................................. 5-279384

[51] Int. Cl.$^6$ ..................................................... B24B 13/02
[52] U.S. Cl. ........................... 451/41; 451/285; 451/286; 451/287; 451/288; 451/289
[58] Field of Search .............................. 457/285–290, 457/41

[56] References Cited

U.S. PATENT DOCUMENTS

| | | | |
|---|---|---|---|
| 4,050,954 | 9/1977 | Basi | 134/2 |
| 4,116,714 | 9/1978 | Basi | 134/3 |
| 4,680,893 | 7/1987 | Cronkhite et al. | 451/287 |
| 5,299,584 | 4/1994 | Miyazaki et al. | 134/56 |
| 5,320,706 | 6/1994 | Blackwell | 451/41 |
| 5,329,732 | 7/1994 | Karlsrud et al. | 451/334 |
| 5,333,413 | 8/1994 | Hashimoto | 451/287 |
| 5,361,545 | 11/1994 | Nakamura | 451/287 |
| 5,375,291 | 12/1994 | Tateyama et al. | 15/302 |
| 5,425,793 | 6/1995 | Mori et al. | 55/385.2 |
| 5,487,398 | 1/1996 | Ohmi et al. | 134/95.1 |
| 5,498,199 | 3/1996 | Karlsrud | 451/289 |

FOREIGN PATENT DOCUMENTS

| | | | |
|---|---|---|---|
| 59-14464 | 1/1984 | Japan | 451/66 |
| 402116471 | 5/1990 | Japan | 451/287 |

OTHER PUBLICATIONS

Japanese Abstract, Application 64–282372, Cleaning Device for Substrate, Katsumi Umeda, Jun. 18, 1991.

*Primary Examiner*—Robert A. Rose
*Assistant Examiner*—George Nguyen
*Attorney, Agent, or Firm*—Hill & Simpson

[57] ABSTRACT

The method and apparatus of polishing and post-processing a substrate by which the particle level after planarization of a semiconductor device by polishing may be reduced. According to the present invention, the substrate of the semiconductor device to be processed is maintained in a wet state since directly after polishing until the end of post-processing.

8 Claims, 6 Drawing Sheets

METHOD AND APPARATUS OF POLISHING WAFER

This is a continuation of application Ser. No. 08/701,561, filed Aug. 22, 1996, abandoned, which is a continuation of application Ser. No. 08/337,482, filed Nov. 8, 1994, abandoned.

BACKGROUND OF THE INVENTION

1. Field of the Invention

This invention relates to a method and apparatus of polishing and post-processing a substrate of a substrate device whereby the particle level after planarization of the semiconductor device by polishing may be reduced.

2. Description of the Related Art

With a semiconductor device, such as VLSI or ULSI, the device step difference in a chip is increasing with progress in the integration degree. For example, in a DRAM employing a stack type capacitor, the cell height cannot be increased beyond a certain value because of the necessity of maintaining a pre-set cell capacity. The result is a significant absolute step difference between the cell area and the peripheral area. On the other hand, with a logical device, such as a gate array, in which a multi-layer interconnection is made for increasing the number of channels of interconnection while suppressing the area in the chip occupied by the area of interconnection, a large absolute step difference is produced between the area of interconnection and the peripheral area.

In the present-day photolithography in which the lowering of the depth of focus caused by the shorter wavelength and the high numerical aperture (NA) poses a serious problem, such large step difference represents a significant, factor obstructing the correct pattern formation. Thus there is an increasing demand for so-called global planarization of reducing the absolute step difference of the device surface.

There are several techniques known for achieving such global planarization. Of these, the chemical mechanical polishing (CMP) is a method having a uniform removal rate for the wafer surface and capable of removing small-sized surface spikes (protrusions) quickly. Typically, such method consists in supplying a polishing slurry containing fine particles of high-purity silica on a polishing turntable on which is bonded a polishing cloth composed of chemical fibers and polishing the surface of the wafer as such wafer surface is brought into sliding contact with the slurry surface from above. The wafer is applied under suction by vacuum against a spindle head. This method is capable of coping with planarization of the oxide film after burial in a trench, planarization of the interlayer insulating film in a multi-layer interconnection or planarization of buried or deposited metal film.

However, with the CMP, there is left unsolved the problem of how to prevent the lowering of device reliability caused by pollution by particles. Among these particles, as the source of pollution, there are fine silica particles contained in the polishing slurry, particles produced from the polished surface as the polishing progresses, or particles produced by fatigue destruction of the polishing cloth. Among these, the fine silica particles are most responsible for pollution.

Thus it has been thought to be most crucial to carry out the chemical mechanical polishing in combination with an effective post-processing method. Such post-processing methods include brush scrubbing (physical scrubbing) or dipping (chemical cleaning or cleaning with chemical solutions). However, it is not possible with these known methods to achieve high productivity or sufficient removal effects.

The reason the high productivity and sufficient removal effects cannot be achieved may be analyzed as follows. That is, there exist hydroxyl groups (—OH) on the surface of the fine silica particles at a rate of $2.4 \sim 3.2 \times 10^4$/cm$^2$. If hydroxy groups also exist on the surface to be polished, hydrogen bonds are formed between both hydroxy groups. Above all, with a process for planarizing the SiO$_X$ based interlayer insulating film, since a large number of hydroxy groups exist on the surface to be polished, the amount of such silica particles is increased.

However, if the surface to be polished is dried after the end of polishing, dehydration condensation is produced at the site of hydrogen linkage, such that the silica particles are coupled by siloxane linkage (Si—O) to the surface to be polished. Once such covalent bond is established, it cannot be removed by customary physical scrubbing or cleaning with a cleaning chemical solution.

On the other hand, the polishing operation and the post-processing operation are carried out in the conventional system by separate devices. However, this leads possibly to an increased area occupied by the devices in the clean room or a decreased throughput ascribable to wafer transport between the devices, thereby possibly incurring the risk of new pollution.

OBJECT AND SUMMARY OF THE INVENTION

It is therefore an object of the present invention to provide a method and apparatus for polishing and subsequently post-processing a substrate whereby particle pollution may be effectively prevented following polishing, especially chemical mechanical polishing.

For accomplishing the above object, it is necessary to suppress generation of siloxane bonds in order to prevent fine silica particles from becoming affixed to the surface to be polished and, to this end, it is crucial for the substrate to be perpetually not dried during transport of the substrate from the polishing process to the next process.

The present invention, which is proposed with this in mind, resides in that the substrate is maintained in a wet state since directly after polishing until the end of post-processing.

The polishing is typically a chemical mechanical polishing.

The post-processing may be carried out by cleaning with a chemical cleaning solution. Such cleaning with the chemical solution may be carried out using an SC-1 cleaning solution (NH$_4$OH/H$_2$O$_2$/H$_2$O) or a dilute hydrofluoric acid or ammonium fluoride (NF$_4$F) commonly employed in a semiconductor process.

The cleaning with the chemical solution may be combined with physical scrubbing for utmost effects. Such physical scrubbing may be enumerated by brush scrubbing, precision scrubbing using deionized water, scrubbing by spraying pressurized water, and ultrasonic scrubbing, inclusive of megasonic scrubbing. Practically, the physical scrubbing may be directly followed by the cleaning with the chemical solution, for utmost effects.

For carrying out the above method, there is employed a polishing apparatus comprising a polishing unit for polishing a substrate by, above all, chemical mechanical polishing, a cleaning unit for cleaning the substrate, and a rinse/drying unit for rinsing and drying the substrate, wherein adjacent ones of these units are interconnected by unit-to-unit wet-transporting devices for transporting the substrate under a wet atmosphere.

The wafer from the polishing process is once held by substrate stand-by means before being supplied to the next cleaning process. Consequently, the substrate stand-by means may be provided with a function of maintaining the wet state of the substrate. Since the substrate is usually maintained on the spindle head during polishing in the face-down position, that is with its surface to be polished facing downwards, while it is maintained during post-processing on the substrate stage in a face-up position, that is with its surface to be polished facing upwards, the substrate stand-by means may also be provided with a function of inverting the substrate upside down.

The cleaning unit includes at least one cleaning chamber for cleaning the substrate with a chemical solution. If the cleaning unit has two or more cleaning chambers, it is possible to use the same chemical solution in each chamber in order to raise the particle level progressively. However, it is also possible to execute the cleaning using plural chemical solutions having different particle removal capabilities.

Alternatively, a cleaning unit may be employed which is provided with at least one physical scrubbing chamber in addition to the cleaning chamber employing the chemical cleaning solution. If the cleaning unit has two or more physical scrubbing chambers, different types of cleaning may be carried out or the front and reverse sides of the substrate may be separately cleaned in the respective chambers.

For the sake of effective particle removal, the physical scrubbing chamber may be preferably arranged ahead of the cleaning chamber employing the chemical cleaning solution.

In any case, it is most desirable to provide spin cleaning means in the cleaning chamber employing the chemical cleaning solution.

The cleaning chambers in the cleaning unit adjacent to each other may be interconnected by unit-to-unit wet-transporting devices capable of transporting the substrates under a wet atmosphere. The means for creating the wet atmosphere may include, for example, sprinkling of pure water using a nozzle or a shower head and ultrasonic humidification.

Since the polishing unit, cleaning unit and the rinse/drying unit have to deal with different particle levels, it is particularly desirable for the inner atmospheres of these units to be separated from one another by partitions. The above-mentioned unit-to-unit wet-transporting devices may be built in these partitions.

Among the above units, the polishing unit has to cope with the maximum particle level. It is therefore desirable for the inner atmosphere in the polishing unit to be lower than that in other units.

Since the substrate may be prevented from being dried until the end of the post-processing following the polishing, the particle level may be maintained at a level removable by customary physical scrubbing or cleaning with the chemical cleaning solution, so that particle pollution may be suppressed effectively.

Above all, in the chemical mechanical polishing employing fine silica particles as abrasive grains, since the drying is prevented in a manner as described above, siloxane bonds are not produced by dehydration condensation even although the fine silica particles are adsorbed to the surface to be polished during the polishing operation due to the interaction between the silica particles and the substrate surface to be polished. Thus the silica particles, representing a major portion of the particles, may be easily removed by customary cleaning with the chemical cleaning solution. If the cleaning with the chemical cleaning solution is combined with the physical scrubbing, the above-mentioned interaction as typified by the hydrogen bonds may be destructed by the mechanical energy exceeding the energy proper to the above-mentioned interaction for further improving the effect of particle removal.

If the cleaning by the chemical cleaning solution is carried out by the spin cleaning, the cleaning proceeds as the flow of the cleaning chemical solution flushes away the particles present on the surface to be polished, thereby significantly diminishing the particle level.

In addition, since the polishing unit, cleaning unit and the rinse/drying unit are interconnected by the unit-to-unit wet-transporting devices, and the substrate stand-by means as well as the unit-to-unit wet-transporting devices interconnecting the cleaning chambers in the cleaning unit is provided with means for maintaining the substrate in the wet state, the sequence of operating processes from the polishing up to the rinsing through the physical scrubbing and cleaning with chemical cleaning solutions may be carried out without allowing the substrate to be dried. By separating these units by associated partitions, the unit with low inherent particle level may be isolated form adverse effects otherwise exerted from the units with high inherent particle level, thereby improving the efficiency in particle removal. Finally, by maintaining the pressure of the inner atmosphere in the polishing unit at a lower value than that in other units, particle diffusion from the inside of the polishing unit to the inside of other units may be prevented for further improving the particle level.

DETAILED DESCRIPTION OF THE PREFERRED EMBODIMENTS

The post-processing method following the polishing of the substrate according to the present invention will be explained based on the results of experiments. Also a typical constitutional example of the polishing apparatus according to the present invention will be explained.

In the first embodiment of the present invention, the effect of wet transport from CMP to spin cleaning (cleaning with a chemical solution) as a post-processing was ascertained by experiments.

Figure 1A:
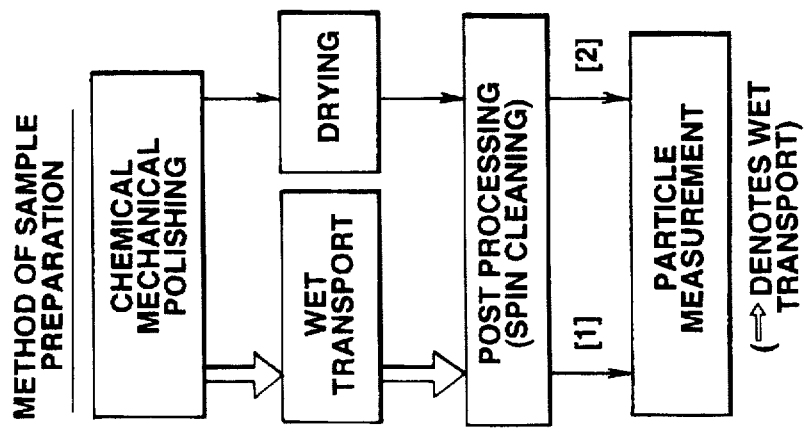
FIG. 1A shows the method for certifying the effects of wet transport from the chemical mechanical polishing to the spin cleaning according to a first embodiment of the present invention.

The method of sample preparation is explained by referring to FIG. 1A. An interlayer insulating film of $SiO_2$, formed to a thickness of 400 nm on each of a number of Si wafers of 5 inch in diameter was partially removed to a remnant film thickness of approximately 200 nm by chemical mechanical polishing under the same conditions. The wafers thus polished were divided into two groups, one of which was transported to the spin cleaning process through water and the other of which was dried once and subsequently transported to the spin cleaning process. Both of the groups were subjected to SC-1 cleaning and DHF (dilute HF) cleaning under the same conditions. The particles having the particle size of 0.3 μm or more were then counted using a particle counter.

Figure 1B:
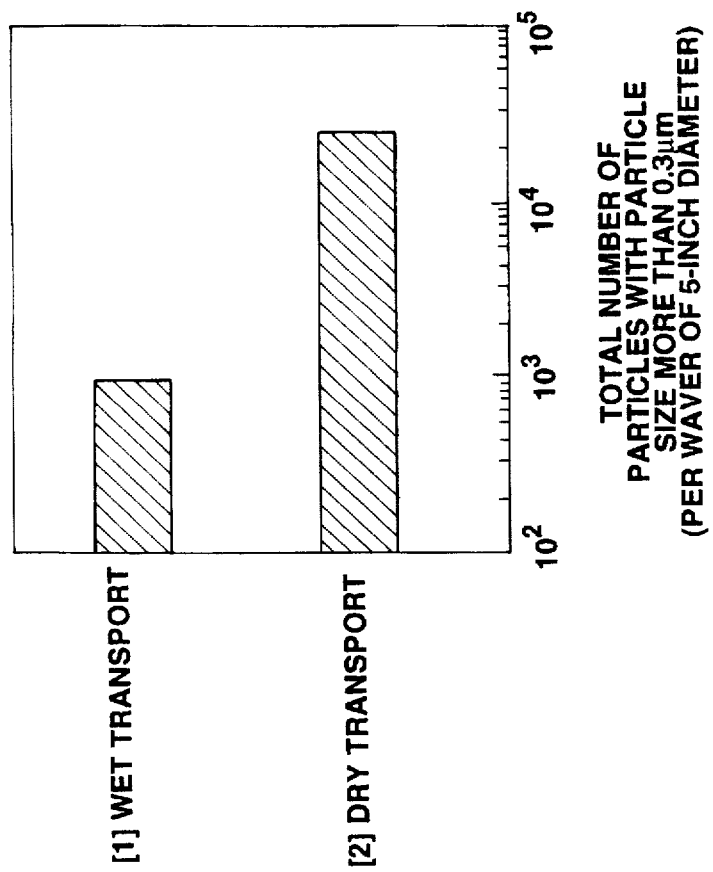
FIG. 1B shows the results.

The results are shown in FIG. 1B, from which it is seen that the total number of particles of the group |1| wet-transported in water is smaller by one digit of magnitude than that of the group [2] transported in a dry state. The reason is that the generation of siloxane bonds between the silica particles and the $SiO_2$ interlayer insulating film is suppressed by the inhibition of drying of the $SiO_2$ interlayer insulating film surface.

The present embodiment has testified to the effectiveness of the wet transport.

The second embodiment of the present invention will now be explained.

In the present second embodiment, the effect of physical cleaning prior to spin cleaning (cleaning with a chemical solution) was demonstrated.

Figure 2A:
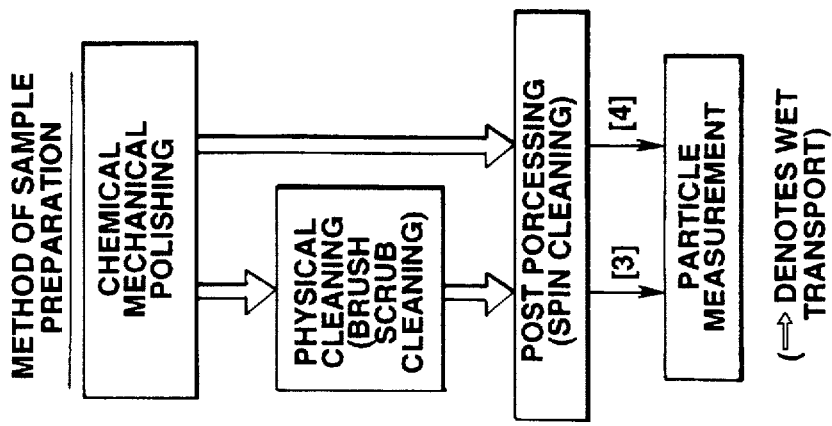
FIG. 2A shows the method of certifying the effect of physical scrubbing prior to spin cleaning and FIG. 2B shows the results.

The method of sample preparation is explained by referring to FIG. 2A. Wafer samples were subjected to chemical mechanical polishing, as in the first embodiment, and divided into two groups, one of which was transported to a spin cleaning process via a brush scrubbing and the other of which was directly transported to the spin cleaning process. Both of the groups wee wet-transported through water. The wafer samples of the two groups were cleaned by SC-1 cleaning and DHF cleaning as in the first embodiment and the total numbers of the particles having the particle size of 0.3 μm were compared.

Figure 2B:
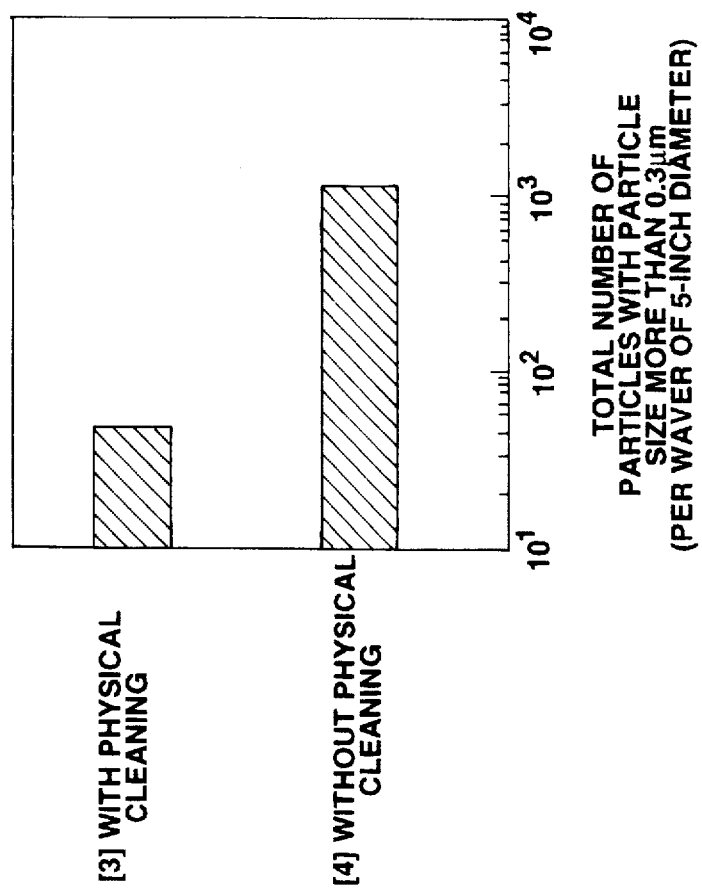

The results are shown in FIG. 2B, from which it is seen that the total number of particles of the group [3] processed with brush-scrubbing is smaller by two digits of magnitude than that of the group [4] not processed with brush scrubbing. This may possibly attributed to the fact that the number of fine silica particles present on the wafer surface is preliminarily reduced by brush scrubbing, as a result of which the number of particles floating in the liquid during spin cleaning is decreased to suppress re-deposition of the particles on the $SiO_2$ interlayer insulating film surface.

With the present embodiment, the effect of the physical cleaning prior to cleaning with the chemical solution was ascertained.

The third embodiment of the present invention will now be explained.

In the present third embodiment, the effect of spin cleaning as the cleaning with the chemical solution was ascertained. That is, sample wafers were subjected to chemical mechanical polishing and brush scrubbing, as in the embodiment, and divided into four groups, of which the group |5| was transported to the spin cleaning process, the group |6| was transported to the dipping process, the group |7| was transported to the precision scrubbing-dipping combination process and the group |8| was transported to the precision scrubbing process. For the spin cleaning and the dipping, a boiled SC-1 solution (SC-1 boil) and diluted hydrofluoric acid (DHF) were employed, respectively. With any of these groups |5| to |8|, the transporting method was the wet-transport through water.

Figure 3A:
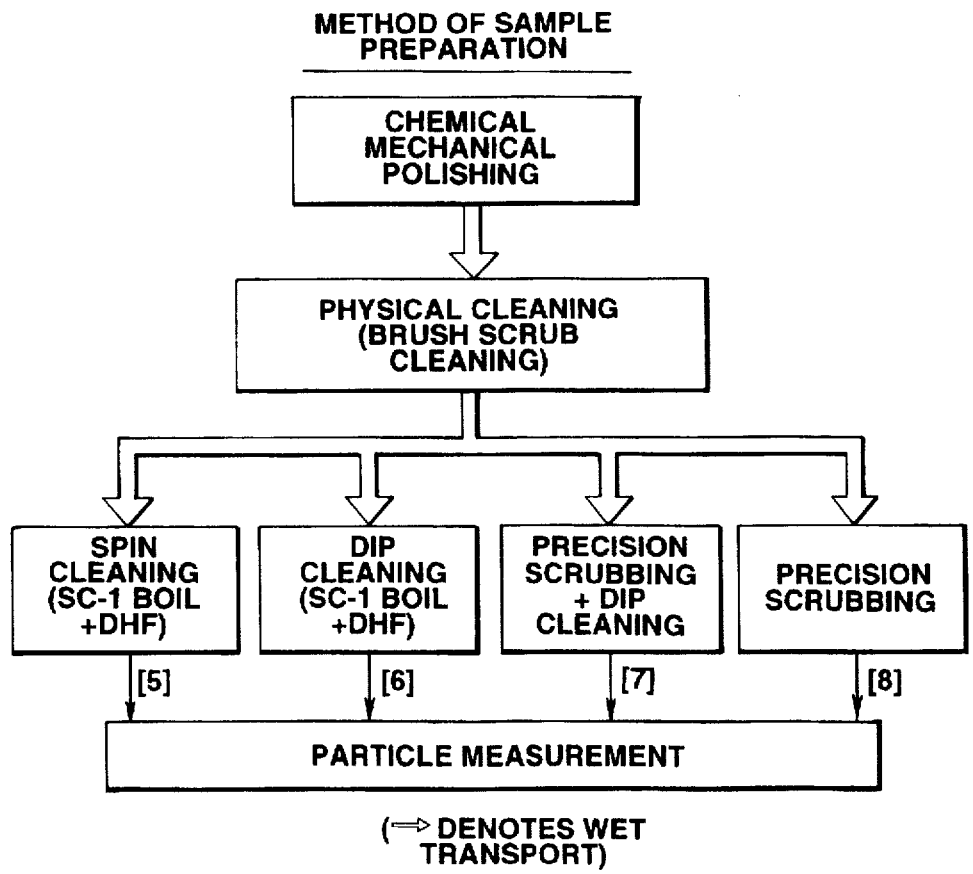
FIG. 3A shows the method for comparing the effect of spin cleaning as cleaning with a chemical solution with that of other cleaning methods.
Figure 3B:
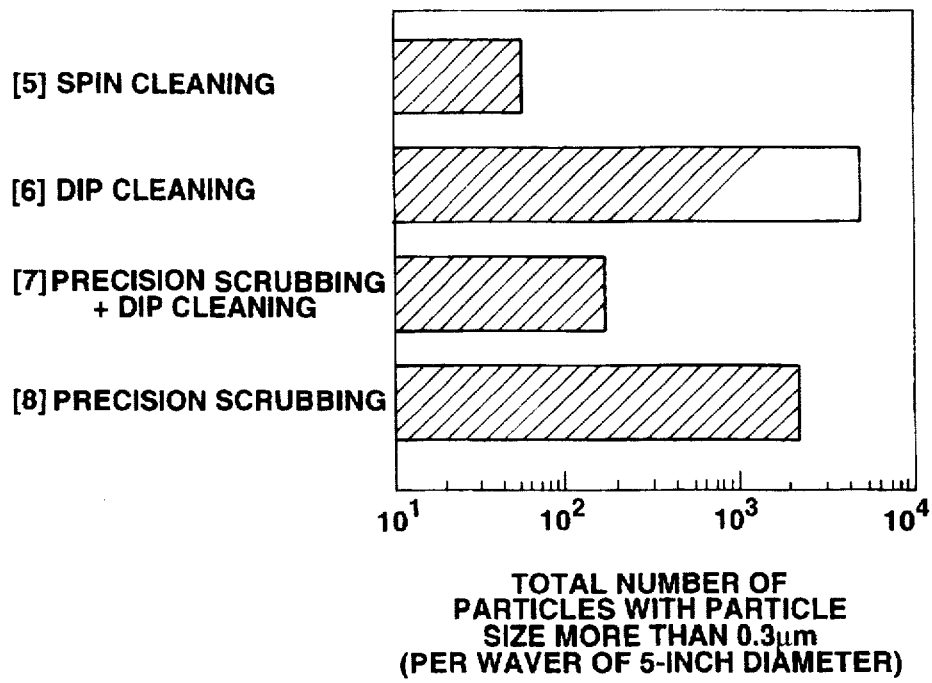
FIG. 3B shows the results.

FIG. 3B shows the results of measurement of the total number of particles having the particle size of 0.3 μm or more. The process for the group |5| subjected to spin cleaning is the same as that for the group [3] of the previous second embodiment and hence the results are also the same. With the group |6| subjected to dipping, the particle level is significantly deteriorated due to re-deposition of particles floating in the cleaning solution. With the group |8| subjected to precision scrubbing, deterioration in the particle level is second to that for the group |6| due possibly to re-deposition of particles remaining on the brush. With the group [7] subjected to the precision scrubbing-dipping combination process, the particle level is not improved beyond the level of the group |5| processed with spin cleaning, although it is improved significantly as compared to the groups [6] and [8]. Thus it has been confirmed that the spin cleaning is the most excellent method as the ultimate cleaning method with the chemical solution.

The fourth embodiment of the present invention will now be explained.

With the present embodiment, the polishing apparatus is configured on the basis of the above results so that a series of operations comprised of the chemical mechanical polishing, physical scrubbing, cleaning with a chemical solution and rinsing in this order are executed continuously without drying the wafer.

Figure 4:
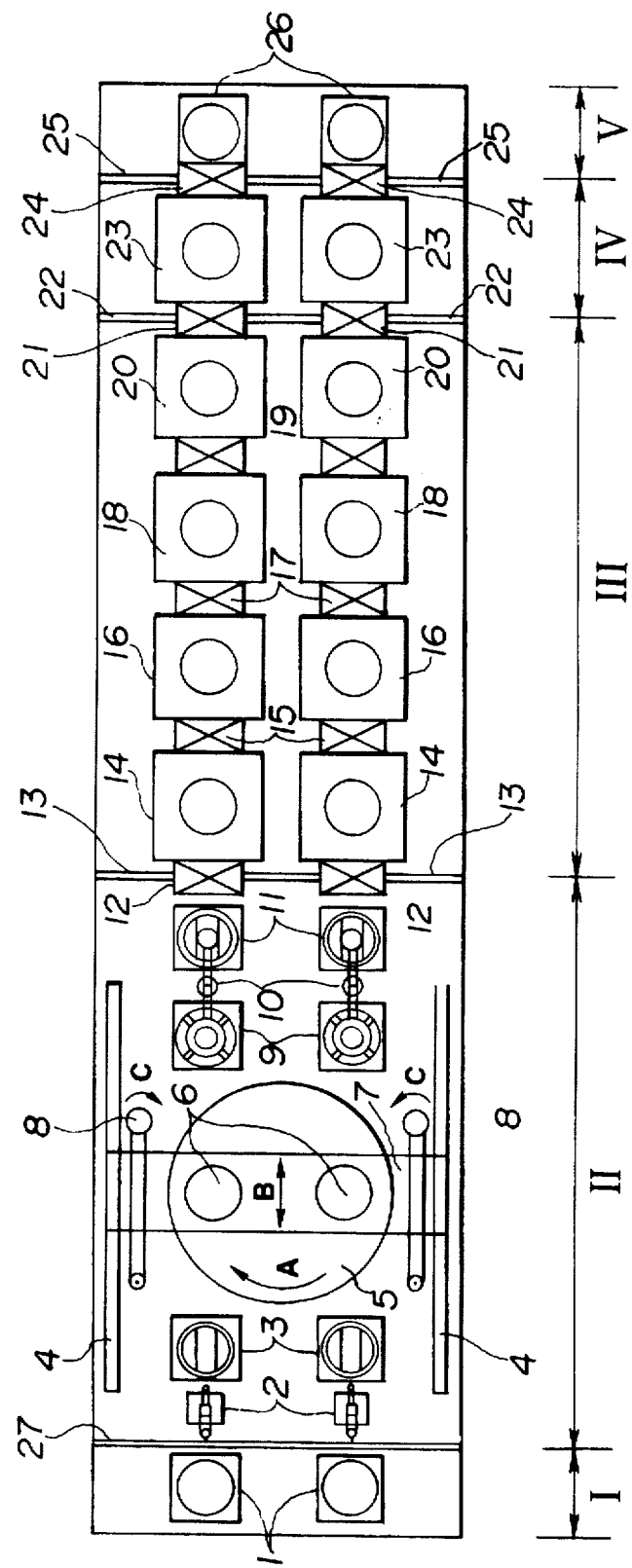
FIG. 4 is a schematic top plan view showing an arrangement of a polishing apparatus according to a fourth embodiment of the present invention.

FIG. 4 schematically shows the above-mentioned polishing apparatus in its entirety. The apparatus includes, according to the sequence of the operating steps, a loader unit I, a polishing unit II, a cleaning unit III, a rinse/drying unit IV and an unloader unit V, arranged in this order in tandem. There are provided two parallel processing lines, each of which is made up of the above-described units, so that two wafers may be processed simultaneously.

Since the above units differ in the degree of cleanness to be achieved thereby, they are separated from one another by partitioning walls 27, 13, 22 and 25, thereby maintaining the degree of cleanness on the unit-by-unit basis. Since the polishing unit II generates the maximum amount of particles, the atmosphere therein is at a lower pressure than in the loader unit I of the preceding stage or in the cleaning unit III of the succeeding stage for preventing particle diffusion.

Unit-to-unit wet-transporting devices 12, 21 are built in partitioning wall sections 13, 22 from the polishing unit II as far as the rinse/drying unit IV. It is through these unit-to-unit wet-transporting devices 12, 21 that the wafers are transported under the wet state.

A unit-to-unit wet-transporting device 24 between the rinse/drying unit IV and the unloader unit V is not designed to provide a wet environment.

The respective units are now explained.

The loader unit I contains two wafer cassettes 1. Each wafer cassette 1 contains plural wafers in a face-up state, that is so that the surfaces thereof to be polished are directed upwards.

The polishing unit II includes vacuum chuck type transporting arms 2 for taking out wafers one by one from the wafer cassette 1 through a partition 27 and inverting the wafers upside down, wafer mounting sections 3 for holding the wafers taken out from the transporting arms 2 in the stand-by position in the face-down state, that is with the wafer surfaces to be polished facing downwards, a spindle head 6 for sucking the wafers held in the stand position on the wafer mounting sections 3 by a vacuum chuck, and a girder-shaped holder 7 for holding the spindle head 6. The polishing unit 11 also includes a guide rail 4 for sliding the holder 7 in the direction shown by arrow B, and a polishing turntable 5 for being rotated in direction indicated by arrow A and slidingly contacted with the wafer surface to be polished at a pre-set pressure for polishing the wafer surface. The polishing unit 11 also includes a dresser 8 mounted for rotation in the direction shown by arrow C about its one end as a supporting point for regenerating a polyurethane abrasive cloth lined on the turntable surface, and wafer mounting sections 9 for holding the polished wafer in the wetted state in its face-down position and for cleaning the spindle head 6. The polishing unit finally includes vacuum chuck type transporting arm sections 10 for taking out wafers from the wafer mounting sections 9 and inverting the wafers thus taken out upside down, and wafer mounting sections 11 for holding the wafers detached from the transporting arm sections 10 in the face-up position.

The wafer mounting sections 9, 11 include drying preventative measures unique to the present invention for holding the substrate from the chemical mechanical polishing process in the wet state. The detailed structure is shown in FIG. 5.

Figure 5:
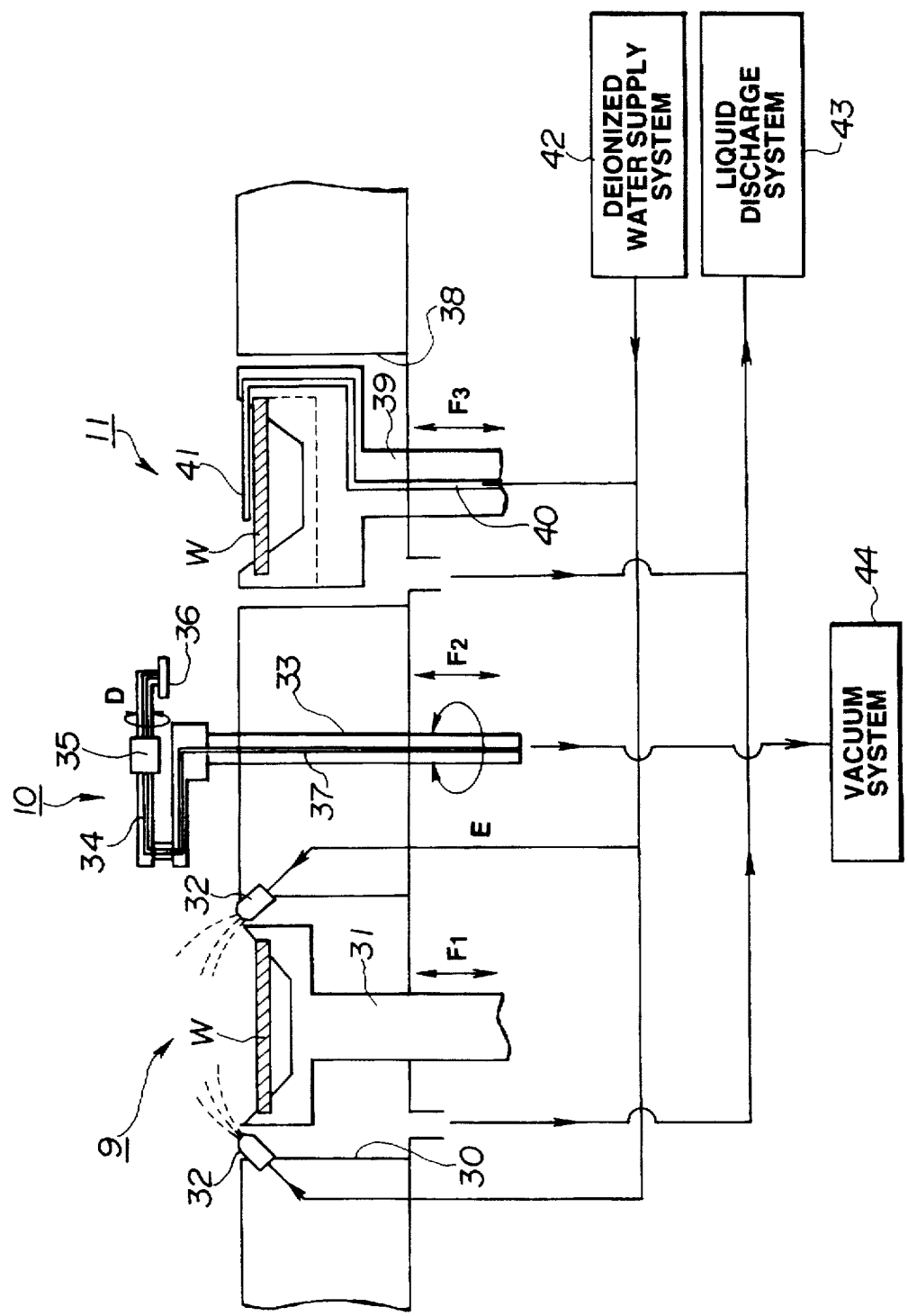
FIG. 5 is a schematic enlarged cross-sectional view showing a typical constitution of a wafer mounting section and a transport arm section in a polishing unit of the polishing apparatus according to a fourth embodiment of the present invention.

FIG. 5 is a schematic enlarged cross-sectional view showing the wafer mounting portions 9, 11 and the transporting arm sections 10.

The polished wafers W, sucked by the spindle head 6, are transported by the holder 7 to the wafer mounting sections 9, and are set in the face-down position on a stage 31 movable vertically as indicated by arrow $F_1$. Deionized water supplied from a deionized water supply system 42 is sprinkled from around the stage 31 via a nozzle 32 in order to prevent the reverse side (the side opposite to the surface to be polished) of the wafer W from being dried. These components are contained in a cup 30 and the deionized water flowing down with the particles entrained therein is supplied via a water drain port in the bottom of the cup 30 to a liquid discharge system 43.

The transporting arm section 10 includes a supporting column 33 capable of being moved vertically as indicated by arrow $F_2$ and of being rotated as indicated by arrow E, an arm 34 connected to the supporting column 33, a motor 35 for rotating the foremost part of the arm 34 as indicated by arrow D, and a chucking head 36 for sucking the wafer by the foremost part of the arm 34. An air vent pipe 37, having its one end connected to a vacuum system 44 and having its other end opened in a chucking surface of the chucking head 36, is passed through the inside of the arm 34 and the supporting column 33. The wafer W is chucked by the vent air passing through the air vent pipe.

The wafer mounting section 11 has a stage 39 for setting the wafer W transported by the arm 34 in the face-up position and for being moved vertically as indicated by arrow $F_3$. The deionized water supplied from the deionized water supply system 42 is sprinkled from a shower head 41 onto the surface (surface to be polished) of the wafer W via a water supply pipe 40 inserted through the inside of the stage 39 for preventing the wafer from being dried. These components are contained in a cup 38 and the deionized water flowing down with the particles entrained therein is supplied via a water drain port in the bottom of the cup 38 to a liquid discharge system 43.

Reverting to FIG. 4, the next cleaning unit III is explained. The cleaning unit III has a series connection of four cleaning chambers per line, totalling eight cleaning chambers 14, 16, 18 and 20. The cleaning chambers are interconnected by in-unit wet transporting devices 15, 17, 19, which may be used simultaneously as the gate valve and for wet transport.

The types of cleaning carried out by these cleaning chambers may be combined in any desired manner. For example, the former two cleaning chambers 14, 16 may be used for physical cleaning, while the latter two may be used for cleaning with chemical solutions, such that the cleaning chambers 14, 16 take charge of brush scrubbing of the front wafer surface to be polished and brush scrubbing of the reverse wafer surface opposite to the front wafer surface, respectively, while the cleaning chambers 16 and 18 take charge of spin cleaning of the reverse wafer surface using the SC-1 cleaning solution and spin cleaning of the front wafer surface using dilute hydrofluoric acid.

In addition to the above-mentioned combination, the brush scrubbing-precision scrubbing combination or the megasonic scrubbing-brush scrubbing combination may be employed by way of the physical scrubbing.

As for the above-mentioned cleaning with the chemical solution, the SC-1 cleaning is carried out for removing the polysilicon layer normally affixed to the reverse surface of the wafer W at the time of completion of the $SiO_2$ interlayer insulating film planarizing process, while the cleaning with dilute hydrochloric acid is carried out for removing metal or particles. As a matter of fact, an optimum chemical solution is selected, taking into account the contents of the upstream side processing of the wafer W.

The drying preventative measures unique to the present invention are adopted in the cleaning chambers 14, 16 and the in-unit wet-transporting devices 15, 17 and 18. As a typical example, the cleaning chamber 14, the in-unit wet-transporting devices 17, 19 or the in-unit wet-transporting devices 12, 21 are basically similar in structure to the in-unit wet-transporting device 15 now to be explained.

Figure 6:
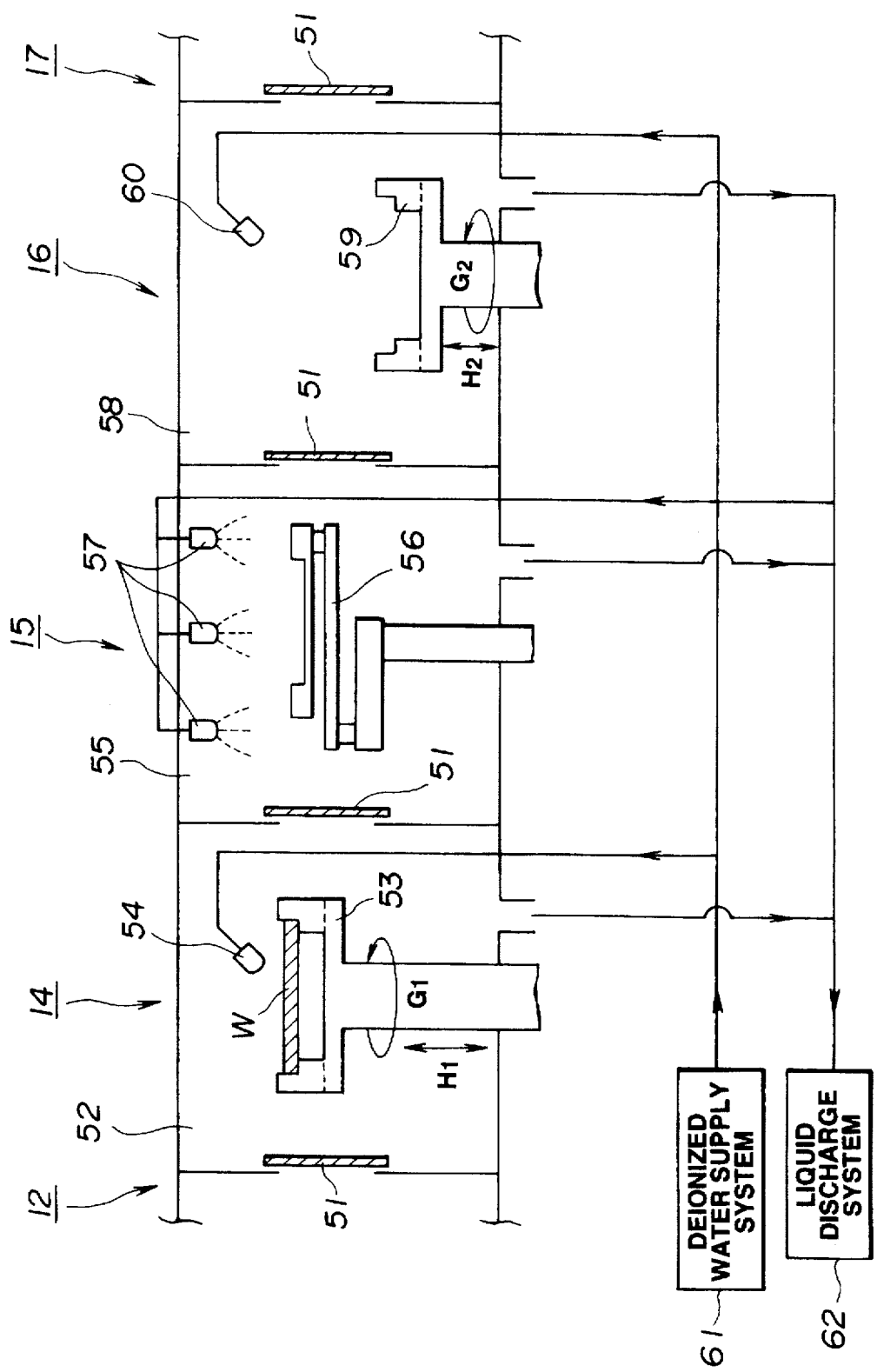
FIG. 6 is a schematic enlarged cross-sectional view showing a typical constitution of a cleaning chamber contained in a cleaning unit of the polishing apparatus and an in-unit transporting mechanism.

The cleaning chamber 14 has a chamber 52 connected to the unit-to-unit wet-transporting device 12 of the previous stage via a gate valve 51, a stage 53 arranged in the chamber 52 for setting the wafer W thereon and for being moved vertically as indicated by arrow $H_1$ and for being rotated as indicated by arrow $G_1$, and a nozzle 54 similarly arranged in the chamber 52 for sprinkling to the wafer W the deionized water supplied from a deionized water supply system 61. In FIG. 6, only the components used in common by the cleaning chambers 14, 16, 18, 20 are shown, while components unique to specific cleaning, such as brushes for physical scrubbing or supply nozzle for cleaning with the chemical solution, are not shown.

The unit-to-unit wet-transporting device 15 is employed for taking out the wafer W cleaned by the cleaning chamber 14 via a gate valve 51, and includes an arm 56 for transporting the wafer W into a chamber 55 and a shower head 57 for sprinkling the deionized water supplied from the deionized water supply system 61 from the top plate of the chamber 55.

As means for affording a wet environment, an ultrasonic humidifying device may be employed in addition to the shower head 57.

If the wafer W needs to be turned upside down between the cleaning chambers 14 and 16, it suffices to attach a motor such as is mounted on the arm 34 to the arm 56.

The cleaning chamber 16 of the next stage is basically the same in structure as the cleaning chamber 14, and includes a chamber 58 connected to the unit-to-unit wet transporting device 15 of the preceding stage via the gate valve 51, a stage 59 arranged in the chamber 58 for being moved vertically as indicated by arrow $H_2$ and for being rotated as indicated by arrow $G_2$, and a nozzle 60 similarly arranged within the chamber 58 for sprinkling deionized water onto the wafer W.

The wafer W, cleaned by the cleaning chamber 16, is transported via the gate valve 51 to the next-stage cleaning chamber 17.

The deionized water, flowing down through the chambers 52, 55, 58 with entrained particles, is drained via a drain port in the bottom of the chambers into a liquid drain system 62.

Reverting to FIG. 4, the next-stage rinse-drying unit IV is explained. The rinse-drying unit IV has a rinse-drying device 23 for rinsing the wafer W with deionized water and for spin drying the wafer W. During spin drying, drying clean air is supplied to the wafer surface via an air filter provided on the top of the apparatus.

The final unit, that is the unloader unit V, contains two wafer cassettes 26. In each wafer cassette 26, the dried wafers are housed sequentially in the face-up position, that is with the surface to be polished facing upwards.

Using the above-described polishing apparatus, hundreds of wafers were processed continuously. It was found that the particle level was maintained at all times at a satisfactory level, and the polishing operation and the subsequent post-processing operations could be achieved with high reproducibility.

It may be seen from above that, since the wafer W may perpetually be maintained in the wet state throughout an integrated process of the physical scrubbing, cleaning with the chemical solution and rinsing, following the completion of the chemical mechanical polishing, so that the particle removal efficiency may be improved significantly. In addition, since the means for carrying out these process steps are unified in a polishing apparatus, the space efficiency in the clean room is improved, while unnecessary pollution may be prevented from occurring, resulting in improved throughput and economic profitability.

What is claimed is:

1. A method for polishing and post-processing a substrate comprising the steps of:

chemically and mechanically polishing the substrate at a chemical mechanical polishing process station;

transporting the substrate from the chemical mechanical process station to a first post-processing apparatus station under a wet atmosphere;

post-processing the polished substrate at the first post-processing apparatus station by physically scrubbing the substrate, transporting the substrate from the first post-processing apparatus station to a second post-processing apparatus station under a wet atmosphere;

post-processing the polished substrate at the second post-processing station by spin-cleaning the substrate in a chemical solution;

wherein the substrate is maintained in a wet state since directly after polishing until the end of second post-processing of the substrate and, wherein an inner atmosphere of the chemical mechanical polishing process station is at a lower pressure than inner atmospheres of the first and second post-processing apparatus stations.

2. A polishing apparatus comprising:

a polishing unit for polishing a substrate, the polishing unit comprising a chemical mechanical polishing unit, a first cleaning unit for cleaning said substrate by physical scrubbing, a second cleaning unit for cleaning the substrate by spin-cleaning the substrate in a chemical solution, and a rinse/drying unit for rinsing and drying said substrate, the polishing unit being connected to the first cleaning unit by a first wet transport device for transporting the substrate from the polishing unit to the first cleaning unit under a wet atmosphere, the first cleaning unit being connected to the second cleaning unit by a second wet transport device for transporting the substrate from the first cleaning unit to the second cleaning unit under a wet atmosphere, the second cleaning unit being connected to the rinse/drying unit by a third wet transport device for transporting the substrate from the cleaning unit to the rinse/drying unit under a wet atmosphere, wherein an inner atmosphere in said polishing unit is under a reduced pressure as compared to inner atmospheres of the remaining units.

3. The polishing apparatus as claimed in claim 2 wherein said polishing unit has means for holding the substrate from the polishing process in a stand-by state while maintaining its wet state.

4. The polishing apparatus of claim 2 wherein said polishing unit, said first cleaning unit, said second cleaning unit and said rinse/drying unit are isolated from one another as to the inner atmosphere of each of said units by partitions and wherein said first, second and third wet transport devices are built in said partitions.

5. The polishing apparatus as claimed in claim 2 wherein the inner atmosphere in said polishing unit is under a reduced pressure as compared to the inner atmospheres of the remaining units.

6. A method for polishing and post-processing a substrate comprising the steps of:

loading a substrate onto a polishing unit;

polishing said substrate in said polishing unit at a first pressure;

transporting said substrate to a first cleaning unit while maintaining said substrate in a wet condition during transporting to said first cleaning unit;

cleaning said substrate at said first cleaning unit by physically scrubbing the substrate at a second pressure;

transporting said substrate from said first cleaning unit to a second cleaning unit while maintaining said substrate in a wet condition during transporting to said second cleaning unit;

cleaning said substrate at said second cleaning unit by spin-cleaning the substrate in a chemical solution at a third pressure;

transporting said substrate from said second cleaning unit to a rinse/drying unit while maintaining said substrate in a wet condition during said transporting to said rinse/drying unit;

rinsing and drying said substrate in said rinse/drying unit at a fourth pressure; and transporting said substrate from said rinse/drying unit to a unloading unit, wherein the first pressure is less than the second, third and fourth pressures.

7. The method of claim 6 wherein the polishing step is carried out at a reduced pressure as compared to the cleaning and rinsing and drying steps.

8. A polishing apparatus comprising a polishing unit for polishing a substrate, a first cleaning unit for cleaning said substrate by physical scrubbing, a second cleaning unit for cleaning said substrate by spin-cleaning in a chemical solution, and a rinse/drying unit for rinsing and drying said substrate, wherein adjacent ones of these units are interconnected by unit-to-unit wet-transporting devices for transporting the substrate under a wet atmosphere, wherein the inner atmosphere in said polishing unit is under a reduced pressure as compared to the inner atmospheres of the remaining units.

* * * * *